(12) United States Patent
Bhuwalka et al.

(10) Patent No.: US 8,587,075 B2
(45) Date of Patent: Nov. 19, 2013

(54) TUNNEL FIELD-EFFECT TRANSISTOR WITH METAL SOURCE

(75) Inventors: Krishna Kumar Bhuwalka, Asansol (IN); Yi-Ming Sheu, Hsin-Chu (TW); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 4 days.

(21) Appl. No.: 12/273,409

(22) Filed: Nov. 18, 2008

(65) Prior Publication Data
US 2010/0123203 A1 May 20, 2010

(51) Int. Cl.
*H01L 29/78* (2006.01)

(52) U.S. Cl.
USPC ............. 257/402; 257/E29.255; 257/E29.268

(58) Field of Classification Search
USPC .................................. 257/E29.255
See application file for complete search history.

(56) References Cited

U.S. PATENT DOCUMENTS

| 4,934,204 | A | 6/1990 | Hadden, Sr. |
| 5,323,020 | A | 6/1994 | Mohammad et al. |
| 5,420,059 | A | 5/1995 | Mohammad et al. |
| 5,683,934 | A | 11/1997 | Candelaria |
| 5,686,739 | A | 11/1997 | Baba |
| 5,705,827 | A | 1/1998 | Baba et al. |
| 6,110,783 | A | 8/2000 | Burr |
| 6,284,579 | B1 * | 9/2001 | Wang et al. ............. 438/179 |
| 6,353,249 | B1 | 3/2002 | Boyd et al. |
| 6,472,685 | B2 | 10/2002 | Takagi |
| 6,897,472 | B2 | 5/2005 | Mears et al. |
| 7,812,370 | B2 | 10/2010 | Bhuwalka et al. |
| 7,834,345 | B2 | 11/2010 | Bhuwalka et al. |
| 8,354,695 | B2 | 1/2013 | Bhuwalka et al. |
| 2001/0048128 | A1 * | 12/2001 | Yano et al. ............. 257/314 |
| 2003/0042547 | A1 | 3/2003 | Deleonibus |
| 2003/0057416 | A1 | 3/2003 | Currie et al. |
| 2004/0262596 | A1 | 12/2004 | Mears et al. |
| 2005/0017275 | A1 * | 1/2005 | Chau et al. ............. 257/289 |

(Continued)

FOREIGN PATENT DOCUMENTS

| CN | 1357926 A | 7/2002 |
| CN | 1591906 A | 3/2005 |
| JP | 61121370 A | 6/1986 |

OTHER PUBLICATIONS

Aydin, C., et al., "Lateral Interband Tunneling Transistor in Silicon-on-Insulator," Applied Physics Letters, Mar. 8, 2004, pp. 1780-1782, vol. 84, No. 10, American Institute of Physics.

(Continued)

*Primary Examiner* — Ha Tran T Nguyen
*Assistant Examiner* — Raj R Gupta
(74) *Attorney, Agent, or Firm* — Slater & Matsil, L.L.P.

(57) ABSTRACT

A semiconductor device includes a channel region; a gate dielectric over the channel region; and a gate electrode over the gate dielectric. A first source/drain region is adjacent the gate dielectric, wherein the first source/drain region is a semiconductor region and of a first conductivity type. A second source/drain region is on an opposite side of the channel region than the first source/drain region, wherein the second source/drain region is a metal region. A pocket region of a second conductivity type opposite the first conductivity type is horizontally between the channel region and the second source/drain region.

19 Claims, 7 Drawing Sheets

(56) References Cited

U.S. PATENT DOCUMENTS

| | | | |
|---|---|---|---|
| 2005/0093033 | A1 | 5/2005 | Kinoshita et al. |
| 2006/0091490 | A1* | 5/2006 | Chen et al. .................. 257/458 |
| 2006/0258072 | A1 | 11/2006 | Kavalieros et al. |
| 2007/0134562 | A1* | 6/2007 | Hosono et al. .................. 430/5 |
| 2007/0178650 | A1* | 8/2007 | Chen et al. .................. 438/301 |
| 2008/0050881 | A1 | 2/2008 | Chen et al. |
| 2008/0067607 | A1 | 3/2008 | Verhulst et al. |
| 2009/0026553 | A1 | 1/2009 | Bhuwalka et al. |
| 2010/0059737 | A1 | 3/2010 | Bhuwalka et al. |
| 2010/0327321 | A1 | 12/2010 | Bhuwalka et al. |
| 2011/0027959 | A1 | 2/2011 | Bhuwalka et al. |

OTHER PUBLICATIONS

Baba, T., "Proposal for Surface Tunnel Transistors," Japanese Journal of Applied Physics, Apr. 15, 1992, pp. L455-L457, vol. 32, Part 2, No. 4B, The Japan Society of Applied Physics.

Bhuwalka, K., et al., "Performance Enhancement of Vertical Tunnel Field-Effect Transistor with SiGe in the delta-p* Layer," Japanese Journal of Applied Physics, 2004, pp. 4073-4078, vol. 43, No. 7A, The Japan Society of Applied Physics.

Bhuwalka, K., et al., "P-Channel Tunnel Field-Effect Transistors Down to Sub-50 nm Channel Lengths," Japanese Journal of Applied Physics, 2006, pp. 3106-3109, vol. 45, No. 4B, The Japan Society of Applied Physics.

Gopalakrishnan, K., et al., "I-MOS: A Novel Semiconductor Device with a Subthreshold Slope Lower than kT/q," International Electron Devices Meeting, 2002, pp. 289-292, IEEE.

Koga, J., et al., "Three-Terminal Silicon Surface Junction Tunneling Device for Room Temperature Operation," IEEE Electron Device Letters, Oct. 1999, pp. 529-531, vol. 20, No. 10, IEEE.

Mears, R., et al., "Silicon Superlattice on SOI for High Mobility and Reduced Leakage," IEEE International SOI Conference Proceedings, 2007, pp. 23-24, IEEE.

Reddick, W., et al., "Silicon Surface Tunnel Transistor," Applied Physics Letters, Jul. 24, 1995, pp. 494-496, vol. 67, No. 4, American Institute of Physics.

Seo, Y.-J., et al., "Transport Through a Nine Period Silicon/Oxygen Superlattice," Applied Physics Letters, Aug. 6, 2001, pp. 788-790, vol. 79, No. 6, American Institute of Physics.

Seo, Y.-J., et al., "Electronic and Optical Characteristics of Multilayer Nanocrystalline Silicon/Absorbed Oxygen Superlattice," Aug. 2001, pp. 4799-4801, vol. 40, Part 1, No. 8, The Japan Society of Applied Physics.

Tateshita, Y., et al., High-Performance and Low-Power CMOS Device Technologies Featuring Metal/High-k Gate Stacks with Uniaxial Strained Silicon Channels on (100) and (110) Substrates, International Electron Devices Meeting, 2006, 4 pp., IEEE.

Tsu, R., et al., "Silicon Epitaxy on Si(100) with Absorbed Oxygen," Electrochemical and Solid-State Letters, 1998, pp. 80-82, vol. 1, No. 2, The Electrochemical Society, Inc.

Appenzeller; J., et al., "Comparing Carbon Nanotube Transistors—The Ideal Choice: A Novel Tunneling Device Design," IEEE Transactions on Electron Devices, vol. 52, No. 12, Dec. 2005, pp. 2568-2576.

Bhuwalka, K. K., et al., "Vertical Tunnel Field-Effect Transistor," IEEE Transactions on Electron Devices, vol. 51, No. 2, Feb. 2004, pp. 279-282.

Boucart, K., et al., "Double-Gate Tunnel FET with High-κ Gate Dielectric," IEEE Transactions on Electron Devices, vol. 54, No. 7, Jul. 2007, pp. 1725-1733.

Bhuwalka, K.K, "Novel Tunneling Devices for Future CMOS Technologies," Universität der Bundeswehr München, Neubiberg, Jan. 10, 2006, 152 pgs.

* cited by examiner

TUNNEL FIELD-EFFECT TRANSISTOR WITH METAL SOURCE

CROSS-REFERENCE TO RELATED APPLICATIONS

This application relates to the following commonly assigned U.S. patent applications: application Ser. No. 11/828,211, filed Jul. 25, 2007, and entitled "Tunnel Field-Effect Transistor with Narrow Band-Gap Channel and Strong Gate Coupling;" and application Ser. No. 12/205,585, filed Sep. 5, 2008, and entitled "Tunnel Field-Effect Transistors with Superlattice Channels," which applications are hereby incorporated herein by reference.

TECHNICAL FIELD

This invention relates generally to semiconductor devices, and more specifically to tunnel field-effect transistors (FETs) having metal sources.

BACKGROUND

Metal-oxide-semiconductor (MOS) is a dominating technology for integrated circuits at 90 nm technology and beyond. A MOS device can work in three regions, depending on gate voltage $V_g$ and source-drain voltage $V_{ds}$, linear, saturation, and sub-threshold regions. The sub-threshold region is a region wherein gate voltage $V_g$ is smaller than threshold voltage $V_t$. The sub-threshold swing represents the easiness of switching the transistor current off and thus is an important factor in determining the speed and power of a MOS device. The sub-threshold swing can be expressed as a function of $m*kT/q$, wherein m is a parameter related to capacitance. The sub-threshold swing of conventional MOS devices has a limit of about 60 mV/decade (kT/q) at room temperature, which in turn sets a limit for further scaling of operation voltage VDD and threshold voltage $V_t$. This limitation is due to the drift-diffusion transport mechanism of carriers. For this reason, existing MOS devices typically cannot switch faster than 60 mV/decade at room temperatures. The 60 mV/decade sub-threshold swing limit also applies to FinFET or ultra-thin body MOSFET on silicon-on-insulator (SOI) devices. However, even with better gate control over the channel, an ultra-thin body MOSFET on SOI or FinFET can only achieve close to, but not below, the limit of 60 mV/decade. With such a limit, faster switching at low operation voltages for future nanometer devices cannot be achieved.

Figure 1A:
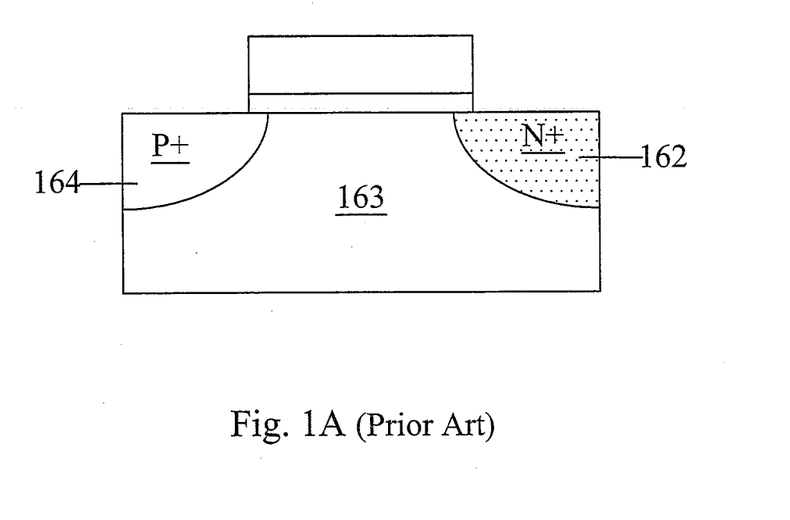
FIGS. 1A and 1B illustrate conventional tunnel field-effect transistors (FETs)

To solve the above-discussed problem, tunnel field-effect transistors (FETs) have been explored. FIG. 1A illustrates a conventional FET device with a heavily doped p-type drain region 164, and a heavily doped n-type source region 162. Drain region 164 is formed by implanting a p-type impurity, while source region 162 is formed by recessing the substrate 163, and epitaxially growing a semiconductor material, followed by doping the semiconductor material with an n-type impurity.

Figure 1B:
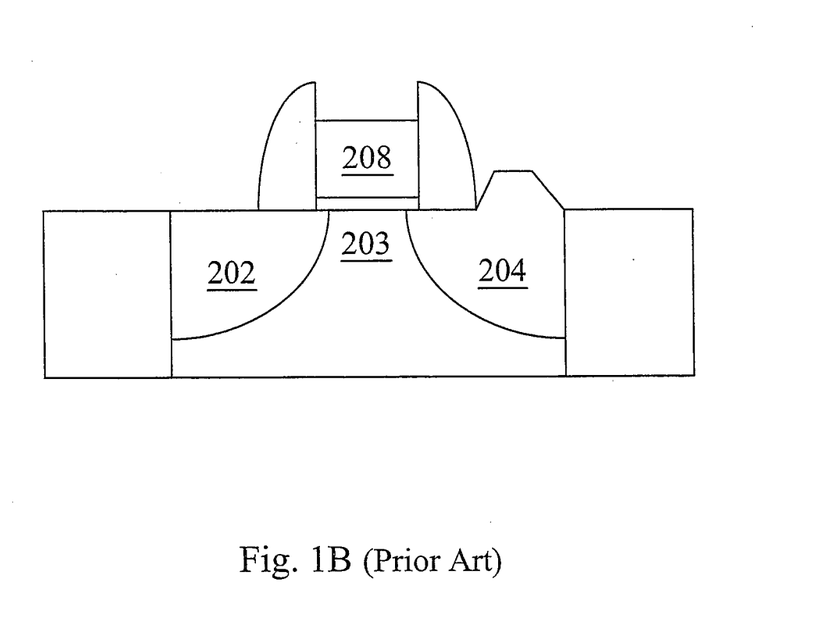

FIG. 1B illustrates an asymmetric tunnel FET device, which includes a heavily doped drain region 202 and a heavily doped source region 204 separated by channel region 203. Drain region 202 comprises silicon, while source region 204 comprises silicon germanium. The channel region 203 is formed of intrinsic silicon. Gate 208 controls channel region 203. The tunnel FET device as shown in FIG. 1B has a kT/q independent sub-threshold swing and a low off-state current. However, such a structure can only improve the on-currents of n-channel tunnel FET devices, while the on-currents of p-channel tunnel FET devices are not improved.

In addition, although the above-discussed conventional tunnel FET devices have the advantageous features of improved on-currents, with the SiGe hetero-structures, which are often desirable for the improved on-currents, the off-currents can become comparable to the conventional MOSFETs.

Therefore, the existing tunnel FETs are not suitable for applications requiring very low power consumption, such as mobile applications. What is needed in the art, therefore, is a method for further increasing the on-currents and reducing leakage currents of tunnel FETs, and the resulting tunnel FETs.

SUMMARY OF THE INVENTION

In accordance with one aspect of the present invention, a semiconductor device includes a channel region; a gate dielectric over the channel region; and a gate electrode over the gate dielectric. A first source/drain region is adjacent the gate dielectric, wherein the first source/drain region is a semiconductor region and of a first conductivity type. A second source/drain region is on an opposite side of the channel region than the first source/drain region, wherein the second source/drain region is a metal region. A pocket region of a second conductivity type opposite the first conductivity type is horizontally between the channel region and the second source/drain region.

In accordance with another aspect of the present invention, a semiconductor device includes a semiconductor substrate; a gate dielectric over the semiconductor substrate; and a gate electrode over the gate dielectric. A semiconductor source/drain region is adjacent the gate dielectric, wherein the semiconductor source/drain region is moderately doped with impurities of a first conductivity type. A pocket region is in the semiconductor substrate and on an opposite side of the gate dielectric than the semiconductor source/drain region. The pocket region is heavily doped with additional impurities of a second conductivity type opposite the first conductivity type. A metal source/drain region adjoins the pocket region and is on an outer side of the pocket region.

In accordance with yet another aspect of the present invention, a semiconductor device includes a channel region; a gate dielectric over the channel region; and a gate electrode over the gate dielectric. A semiconductor drain region is adjacent the gate dielectric, wherein the semiconductor drain region is moderately doped with impurities of a first conductivity type. The semiconductor device further includes a drain silicide over and contacting the drain region; a drain contact plug over and physically contacting the drain silicide; and a pocket region on an opposite side of the channel region than the semiconductor drain region. The pocket region is heavily doped with additional impurities of a second conductivity type opposite the first conductivity type. A metal source region adjoins the pocket region and is on an opposite side of the pocket region than the channel region. The metal source region substantially extends to underlie the gate electrode. A source contact plug physically contacts the metal source region.

The advantageous features of the present invention include improved on-currents and reduced source-drain leakage currents.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Novel tunnel field-effect transistors (FETs) having metal sources and the methods of forming the same are provided. The intermediate stages of manufacturing preferred embodiments of the present invention are illustrated. The variations of the preferred embodiments are then discussed. Throughout the various views and illustrative embodiments of the present invention, like reference numbers are used to designate like elements.

Figure 2:
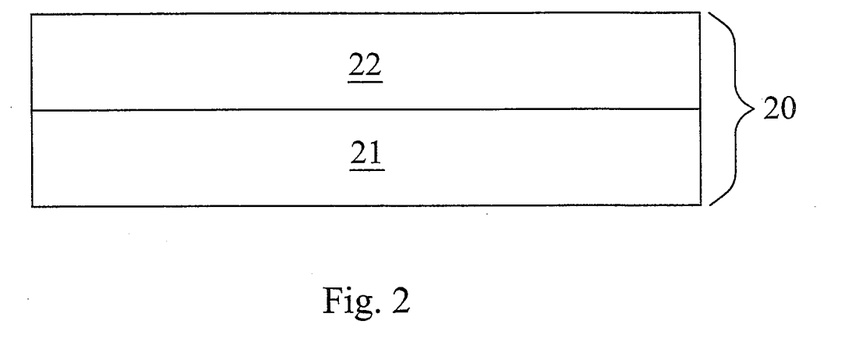
FIGS. 2 through 7 are cross-sectional views of intermediate stages in the manufacturing of an embodiment of the present invention.

The formation of an embodiment of the present invention is provided in FIGS. 2 through 7. Referring to FIG. 2, substrate 20 is provided. In an embodiment, substrate 20 is a bulk substrate comprising a single-crystalline semiconductor material, such as silicon, or a compound semiconductor material such as silicon germanium. In other embodiments, substrate 20 may include more than one layer. In the following discussed examples, substrate 20 includes an upper semiconductor layer 22 that is preferably intrinsic. In an embodiment, layer 22 is undoped. Alternatively, layer 22 is lightly doped to a concentration of less than about $1E15/cm^3$. In yet other embodiments, substrate 20 may have a silicon-on-insulator or silicon-on-carbide structure, wherein layer 22 may be located on an insulator layer or a carbide layer (denoted as layer 21).

Figure 3:
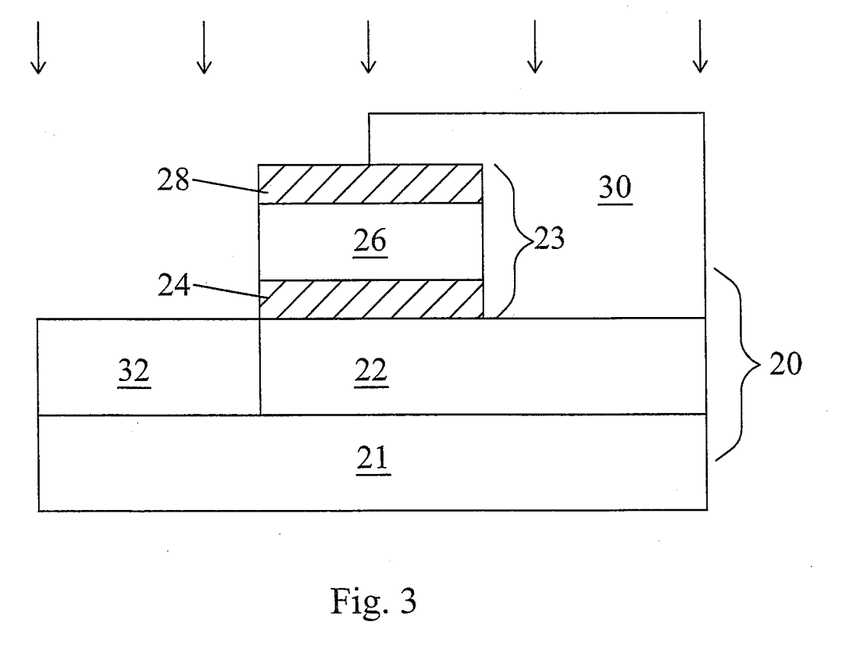

FIG. 3 illustrates the formation of gate stack 23, which includes gate dielectric 24, gate electrode 26, and hard mask 28. As is known in the art, the formation of gate stack 23 includes forming a gate dielectric layer, forming a gate electrode layer on the gate dielectric layer, forming a hard mask layer on the gate electrode layer, and patterning the stacked layers. Photo resist 30 is then applied and patterned, followed by an implantation to dope an n-type impurity, which may include phosphorous, arsenic, and combinations thereof. The implantation may be vertically performed, or tilted toward gate stack 23. As a result, drain region 32 is formed. In an embodiment, drain region 32 is moderately doped. Throughout the description, the term "moderately doped" indicates an impurity concentration of lower than "heavily doped," and may be between about $10^{18}/cm^3$ and about $10^{20}/cm^3$. One skilled in the art will realize, however, that the term "moderately doped" is a term of art, and may change if different formation technologies are used. Drain region 32 may be substantially aligned to the edge of gate stack 23 when the implantation is substantially vertical, or extend under gate stack 23 if the implantation is tilted. Photo resist 30 is then removed.

Figure 4:
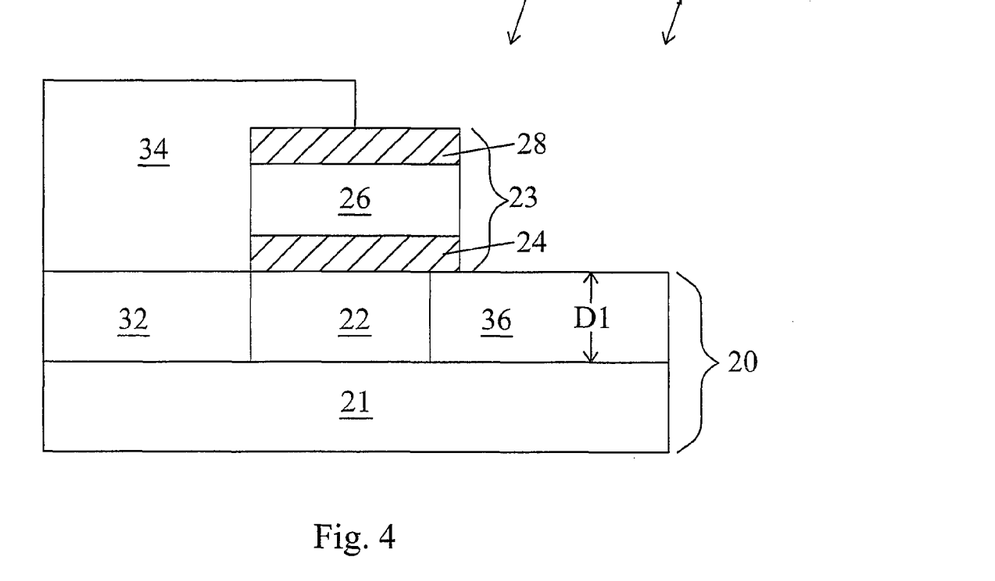

Referring to FIG. 4, photo resist 34 is applied and patterned, covering drain region 32 and a portion of gate stack 23. An implantation is then performed to dope a p-type impurity, such as boron, indium, and combinations thereof, followed by the removal of photo resist 34. The implantation is preferably tilted toward gate stack 23, although it may also be vertical. As a result, source pocket region 36 is formed, which preferably extends under gate stack 23. Source pocket region 36 is preferably heavily doped to a concentration of, for example, greater than about $1E20/cm^3$. The high concentration in source pocket region 36 serves two purposes. First, it reduces the on-resistance so that the on-current of the resulting tunnel FET is increased. Second, the concentration in source pocket region 36 needs to be high enough so that it does not form a Schottky junction with the subsequently formed metal source 50 (not shown in FIG. 4, refer to FIG. 6). The depth D1 of source pocket region 36 is preferably greater than about 5 nm.

Figure 5:
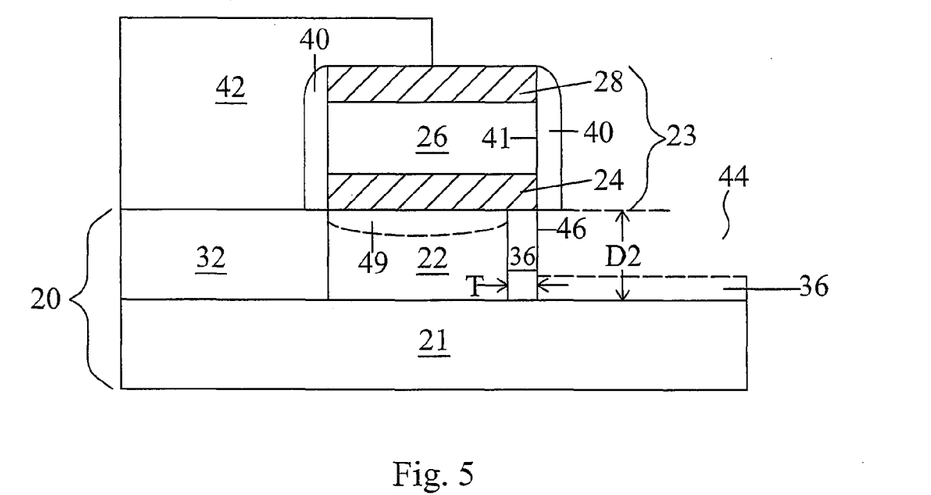
Figure 6:
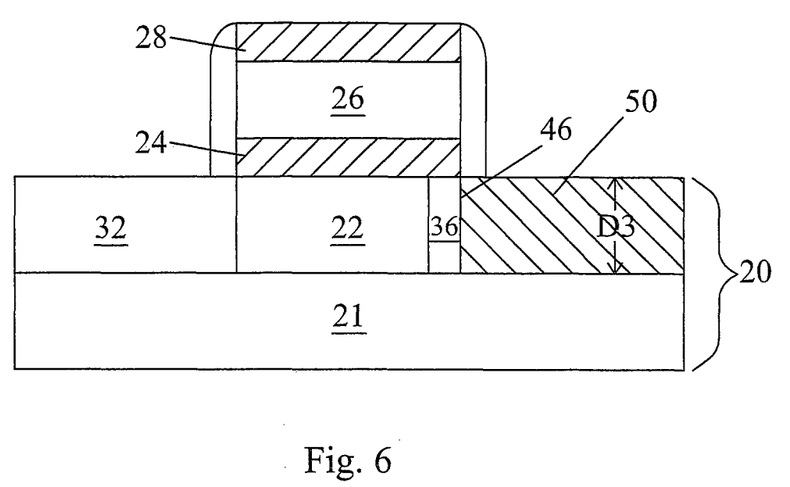

Referring to FIG. 5, gate spacers 40 are formed on the sidewalls of gate stack 23. Next, the drain side of the structure as shown in FIG. 4 is masked, for example, by photo resist 42, while the source side is exposed. The exposed substrate 20 is then etched to form recess 44. Preferably, the etching is anisotropic with an isotropic component, so that recess 44 may extend directly under gate spacer 40, although the recessing may also be substantially anisotropic or isotropic. Alternatively, gate spacers 40 are formed after the formation of recess 44, or even after the formation of metal source 50 as shown in FIG. 6. Preferably, the depth D2 of recess 44 is substantially equal to, or less than, depth D1 (refer to FIG. 1) of source pocket region 36. In this case, however, a remaining layer of source pocket region 36 (dotted line) may exist under recess 44. Alternatively, in the case source pocket region 36 is substantially only under gate stack 23, source pocket region 36 will have no remaining portion under recess 44.

After the formation of recess 44, there is still a remaining portion of source pocket region 36 separating recess 44 from the channel region 49 of the resulting tunnel FET, wherein channel region 49 is a portion of layer 22 directly underlying gate stack 23. The remaining portion of source pocket region 36 may spread for a thickness T between about 2 nm to about 10 nm, although it may be greater or smaller. Preferably, the inner edge 46 of recess 44 is substantially vertically aligned to the respective edge 41 of gate electrode 26. Alternatively, inner edge 46 may be directly under gate electrode 26, although inner edge 46 may also be horizontally spaced apart from, and on an outer side of edge 41. The horizontal distance between inner edge 46 and edge 41 is referred to as proximity hereinafter, which affects the performance of the resulting tunnel FET. The details will be provided in subsequent paragraphs.

Next, as shown in FIG. 6, metal source 50 is formed, for example, by selectively filling a metallic material in recess 44. The formation of metal source 50 may be performed by, for example, electroless plating. Metal source 50 comprises a metal, with an atomic percentage of the metal being greater than about 50%, and more preferably greater than about 80%. Metal source 50 may also be a substantially pure metal source with the atomic percentage of the metal greater than about 95%. The thickness D3 of metal source 50 is preferably greater than about 10 nm, and more preferably between about 5 nm and about 15 nm. The desirable metals for forming metal source 50 preferably have a band-edge work function as regard to the conductivity type of source pocket region 36. In an embodiment in which source pocket region 36 is of p-type, metal source 50 preferably comprises a high work-function metal having a work function close to the conduction band of layer 22 (which may comprise silicon). The exemplary work function of the respective metal source 50 may be greater than about 4.9 eV. Accordingly, metal source 50 may comprise metals such as cobalt, ruthenium, platinum, or the like. Conversely, if source pocket region 36 is of n-type, metal source 50 preferably comprises a low work-function metal having a work function close to the valence band of layer 22. The exemplary work function of the respective metal source 50 may be less than about 4.3 eV. Accordingly, metal source 50 may comprise metals such as Zr, Al, Ti, or the like. Metal source 50 may be formed of substantially pure metal(s) or metal compounds, although it may also contain metal compounds such as metal silicide or the like.

Figure 7:
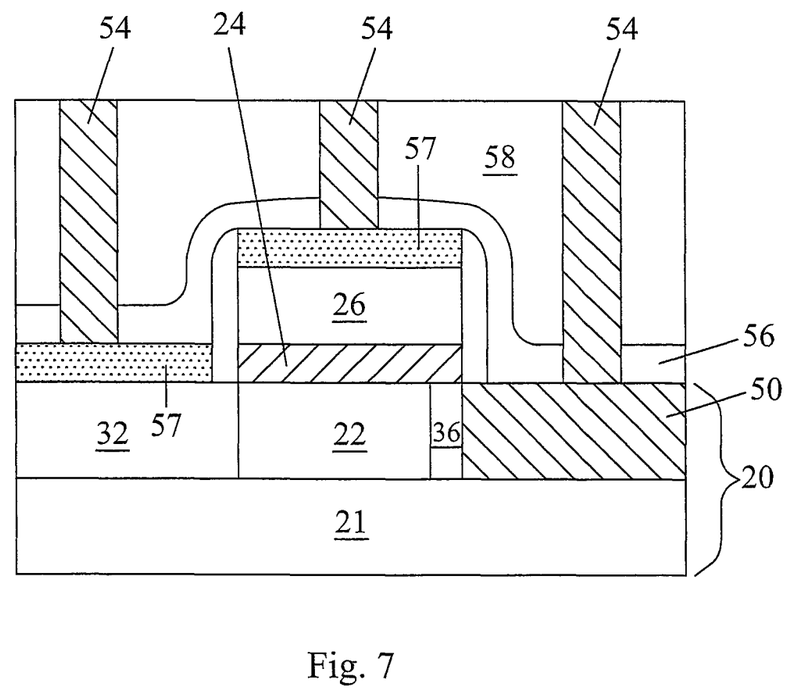

Referring to FIG. 7, hard mask 28 is removed, and contact plugs 54, etch stop layer 56, and inter-layer dielectric 58 are formed. The formation processes are well known in the art, and hence are not repeated herein. Silicide layers 57 may be formed on drain region 32, and possibly on gate electrode 26 if it is formed of a semiconductor material. However, no silicide is formed on metal source 50. Contact plug 54 connected to metal source 50 is preferably not in contact with, and is preferably spaced apart from, source pocket region 36. Etch stop layer 56 is formed over drain region 32, source pocket region 36, and gate 26.

In the embodiment discussed in the preceding paragraphs, the gate-first approach is used, wherein the gate dielectrics and gate electrodes are formed before the formation of source/drain regions. In alternative embodiments, the gate-last approach may be used by replacing gate stack 23 (which will be a dummy gate stack 23) with another gate dielectric and another gate electrode. One skilled in the art will realize the process details of the gate-last approach. Further, the orders for forming some of the features may be different from the illustrated embodiment. For example, the formation of source pocket region 36 may be performed after the formation of metal source 50.

In the preceding paragraphs, an n-type channel tunnel FET is discussed. By inverting the conductivity types of various regions, such as drain region 32, the channel region (if doped), and source pocket region 36, a p-type channel device may be formed. Meanwhile, the work function of metal source 50 is preferably changed from high work-function metals to low work-function metals, as discussed in the preceding paragraphs.

Figure 8:
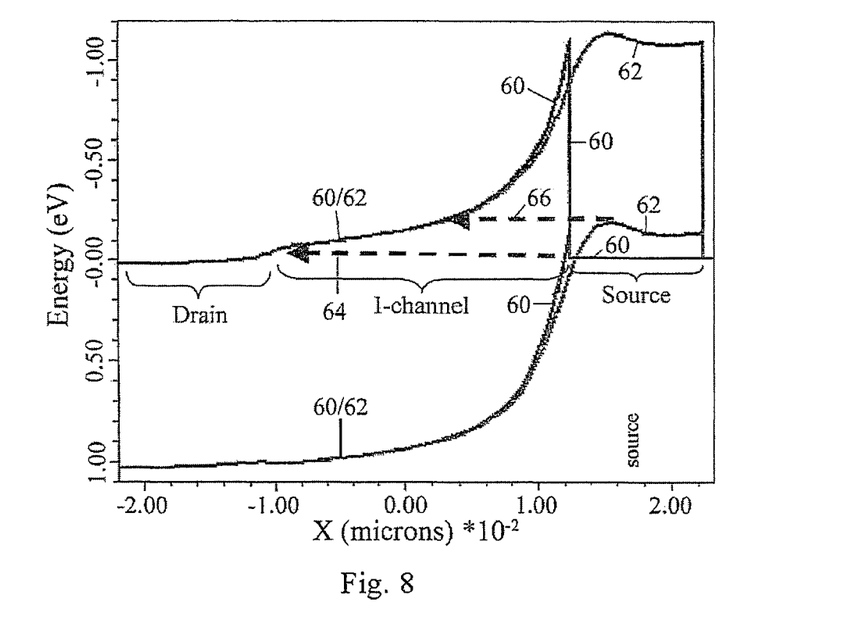
FIG. 8 illustrates band diagrams of a metal-source tunnel FET and a semiconductor-source tunnel FET at "off" state.
Figure 9:
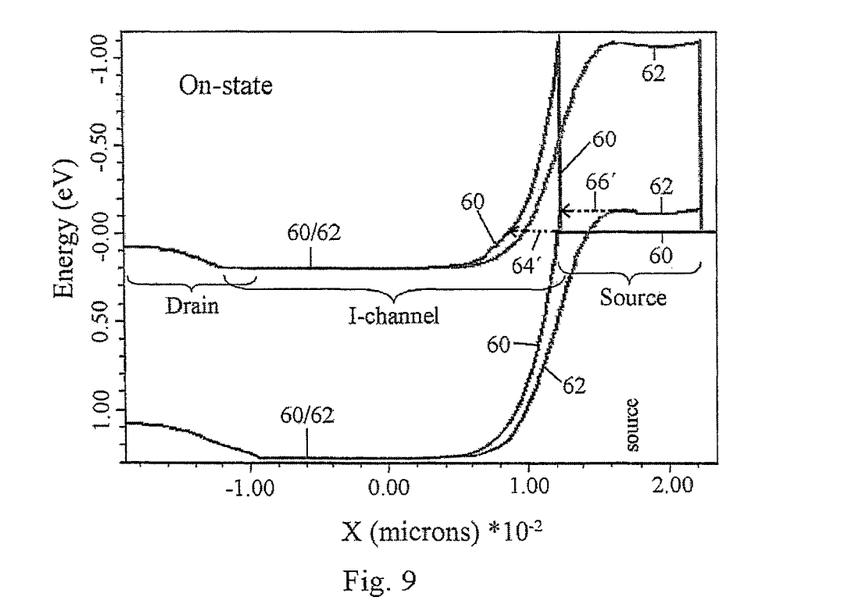
FIG. 9 illustrates band diagrams of a metal-source tunnel FET and a semiconductor-source tunnel FET at "on" state.

The advantageous features of the present invention include reduced leakage current (off-current) and enhanced on-current. Simulation results have revealed that compared to tunnel FETs having semiconductor sources, the off-currents of the present invention may be reduced by one order. The possible reasons may be explained using FIGS. 8 and 9. FIG. 8 illustrates the band diagrams of tunnel FETs at "off" state, and FIG. 9 illustrates the band diagrams of tunnel FETs at "on" state. Lines 60 represent the valence bands and conduction bands of a tunnel FET (referred to as a metal-source FET hereinafter) having a metal source, while lines 62 represent the valence bands and conduction bands of a tunnel FET (referred to as a semiconductor-source FET hereinafter) having a semiconductor source. The source region, the drain region, and the channel are marked in FIG. 8. It is noted that the metal source has a fixed (pinned) Fermi level, and hence the tunneling barrier width (the length of arrow 64) of the metal-source FET is greater than the tunneling barrier width (the length of arrow 66) of the semiconductor-source FET. The greater tunneling barrier width of the metal-source FET results in a reduced off-current.

In FIG. 9, on the other hand, since the Fermi level of the semiconductor-source FET is not pinned, the shift of the valence band of the semiconductor-source FETs toward source sides causes the increase in the tunneling barrier width (the length of arrow 66'). Conversely, since the Fermi level of the metal-source FET is pinned, its tunneling barrier width (the length of arrow 64') may be reduced more, resulting in increased on-currents. Further simulation results have revealed that for the metal-source FET, the tunneling occurs closer to the insulator-semiconductor interface than the semiconductor-source FET, and hence the on-current of the metal-source FET is increased.

Figure 10:
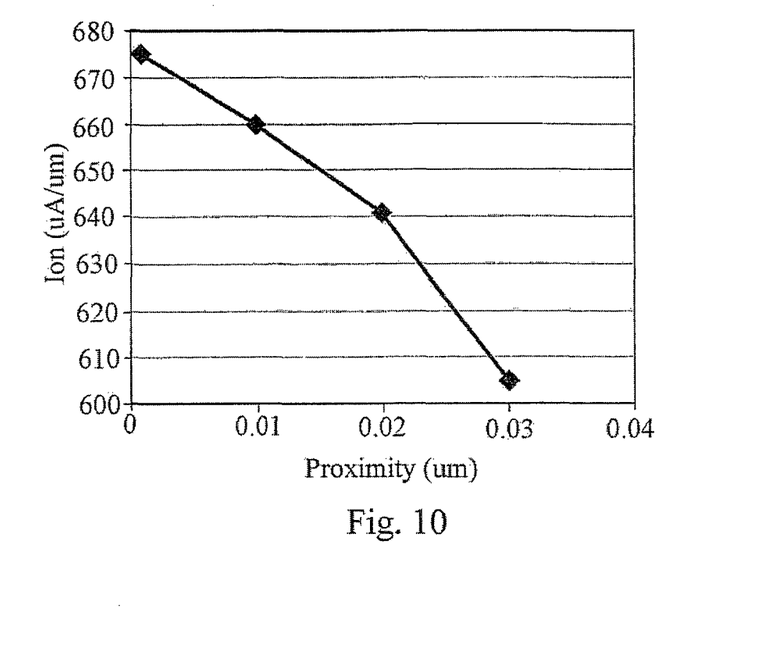
FIGS. 10-12 illustrate the effect of the proximity to the performance of the metal-source tunnel FETs.
Figure 11:
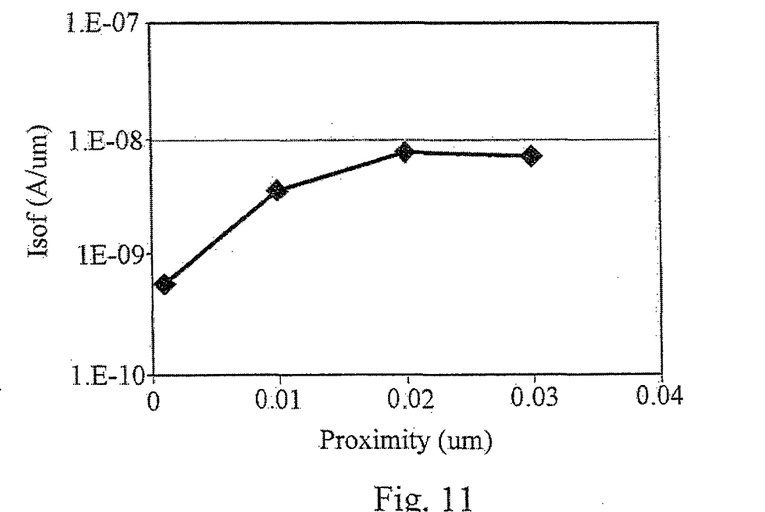
Figure 12:
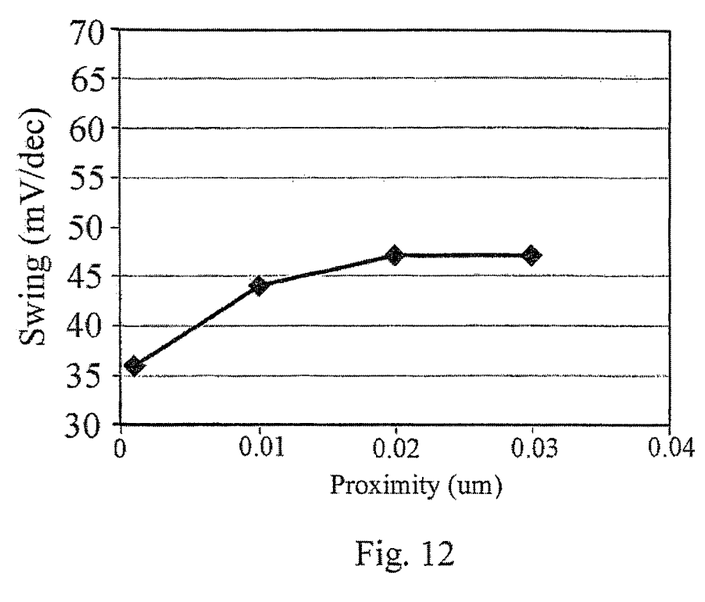

Simulation results also have revealed the relationship between the proximity and the performance of tunnel FETs, wherein the proximity is the horizontal distance between the inner edge 46 (refer to FIG. 5) and the respective edge 41 of gate electrode 26. A positive proximity indicates that the inner edge 46 is not under gate electrode 26. FIG. 10 illustrates the on-currents of the tunnel FET embodiments of the present invention as a function of the proximity. It is noted that with the reduction of the proximity, the on-currents increase. On the other hand, FIG. 11 illustrates the off-currents of the tunnel FET embodiments as a function of the proximity. It is noted that with the reduction of the proximity, the off-currents reduce. FIG. 12 illustrates the sub-threshold swing of the tunnel FET embodiments of the present invention as a function of the proximity. It is also noted that with the reduction of the proximity, the sub-threshold swing decreases, indicating a better performance. The simulation results as shown in FIGS. 10-12 indicate that to improve the performance of the tunnel FET having the metal source, the proximity is preferably as small as possible, and hence the inner edge 46 (FIG. 6) of metal source 50 is preferably vertically aligned to, and may even underlie, the respective edge 41 of gate electrode 26.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. An asymmetrical semiconductor device comprising:
a channel region;
a gate dielectric over the channel region;
a gate electrode over the gate dielectric;
a first source/drain region adjacent the gate dielectric, wherein the first source/drain region is a semiconductor region and of a first conductivity type;
a second source/drain region on an opposite side of the channel region than the first source/drain region, wherein the second source/drain region is a metal region, and wherein the first source/drain region and the second source/drain region are asymmetrical in consideration of the semiconductor region and the metal region; and a pocket region of a second conductivity type opposite the first conductivity type horizontally between the channel region and the second source/drain region, wherein the pocket region is heavily doped so that the pocket region and the metal region do not form a Schottky junction.

2. The asymmetrical semiconductor device of claim 1, wherein the pocket region has a depth no less than a depth of the second source/drain region.

3. The asymmetrical semiconductor device of claim 1, wherein the channel region is intrinsic.

4. The asymmetrical semiconductor device of claim 1, wherein the second source/drain region has an inner edge at least substantially vertically aligned to a respective edge of the gate electrode.

5. The asymmetrical semiconductor device of claim 4, wherein the inner edge of the second source/drain region extends to directly under the gate electrode.

6. The asymmetrical semiconductor device of claim 1, wherein the pocket region is heavily doped, and the first source/drain region is moderately doped.

7. The asymmetrical semiconductor device of claim 6, wherein the second source/drain region comprises a metal having a band-edge work function with regard to the second conductivity type.

8. The asymmetrical semiconductor device of claim 7, wherein the pocket region is of p-type, and wherein the metal has a work function close to a conduction band of silicon.

9. The asymmetrical semiconductor device of claim 7, wherein the pocket region is of n-type, and wherein the metal has a work function close to a valence band of silicon.

10. An asymmetrical semiconductor device comprising:
a semiconductor substrate;
a gate dielectric over the semiconductor substrate;
a gate electrode over the gate dielectric;
a semiconductor source/drain region adjacent the gate dielectric, wherein the semiconductor source/drain region is moderately doped with impurities of a first conductivity type;
a pocket region in the semiconductor substrate and on an opposite side of the gate dielectric than the semiconductor source/drain region, wherein the pocket region is heavily doped with additional impurities of a second conductivity type opposite the first conductivity type; and
a metal source/drain region adjoining the pocket region and on an outer side of the pocket region, wherein the metal source/drain region and the pocket region do not form a Schottky junction, and wherein the semiconductor source/drain region and the metal source/drain region are asymmetrical in consideration of the semiconductor source/drain region and the metal source/drain region.

11. The asymmetrical semiconductor device of claim 10, wherein a first concentration of the impurities in the semiconductor source/drain region is less than $1E20/cm^3$, and a second concentration of the additional impurities in the pocket region is greater than $1E20/cm^3$.

12. The asymmetrical semiconductor device of claim 10, wherein a bottom of the metal source/drain region adjoins a semiconductor material having a low doping concentration.

13. The asymmetrical semiconductor device of claim 10, wherein the pocket region is of p-type, and wherein the metal source/drain region has a work function greater than about 4.9 eV.

14. The asymmetrical semiconductor device of claim 10, wherein the pocket region is of n-type, and wherein the metal source/drain region has a work function less than about 4.3 eV.

15. The asymmetrical semiconductor device of claim 10, wherein a portion of the semiconductor substrate between the semiconductor source/drain region and the pocket region is intrinsic.

16. An asymmetrical semiconductor device comprising:
a channel region;
a gate dielectric over the channel region;
a gate electrode over the gate dielectric;
a semiconductor drain region adjacent the gate dielectric, wherein the semiconductor drain region is moderately doped with impurities of a first conductivity type;
a drain silicide over and contacting the semiconductor drain region;
a drain contact plug over and physically contacting the drain silicide;
a pocket region on an opposite side of the channel region than the semiconductor drain region, wherein the pocket region is heavily doped with additional impurities of a second conductivity type opposite the first conductivity type;
a metal source region adjoining the pocket region and on an opposite side of the pocket region than the channel region, wherein the metal source region substantially extends to underlie the gate electrode and the metal source region and the pocket region do not form a Schottky junction, and wherein the semiconductor drain region and the metal source region are asymmetrical in consideration of the semiconductor drain region and the metal source region; and
a source contact plug physically contacting the metal source region.

17. The asymmetrical semiconductor device of claim 16, wherein an atomic percentage of metals in the metal source region is greater than about 80%.

18. The asymmetrical semiconductor device of claim 16, wherein the metal source region is formed of substantially pure metal.

19. The asymmetrical semiconductor device of claim 16, wherein the metal source region is free from silicides.

* * * * *